Figure 1:
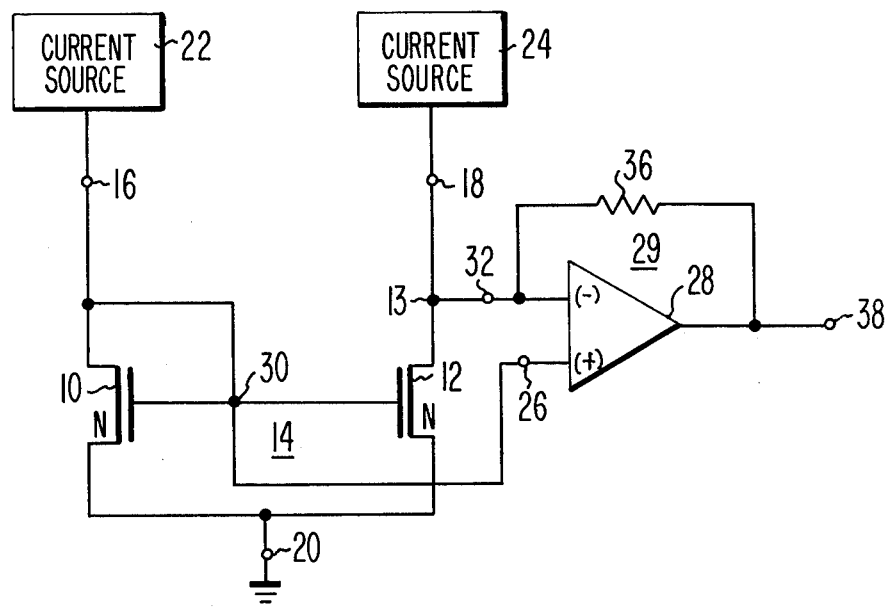

United States Patent [19]

Rosenthal

[11] 4,055,812
[45] Oct. 25, 1977

[54] CURRENT SUBTRACTOR

[75] Inventor: Bruce David Rosenthal, Randolph, N.J.

[73] Assignee: RCA Corporation, New York, N.Y.

[21] Appl. No.: 714,122

[22] Filed: Aug. 13, 1976

[51] Int. Cl.² ............................................. H03F 3/45
[52] U.S. Cl. .................................... 330/253; 330/257
[58] Field of Search ................... 330/22, 25, 28, 30 D, 330/35, 69, 75

[56] References Cited
U.S. PATENT DOCUMENTS

| 3,546,564 | 12/1970 | Denny | 330/30 D |
| 3,588,530 | 6/1971 | Langan | 330/30 D |

Primary Examiner—James B. Mullins
Attorney, Agent, or Firm—H. Christoffersen; S. Cohen; A. L. R. Limberg

[57] ABSTRACT

A current subtractor circuit utilizing a current mirror amplifier (CMA) as the subtracting element. An operational amplifier converts the difference current to an output voltage proportional to this difference. The operational amplifier additionally may be utilized to equalize the voltage drop across the conduction paths of the transistors comprising the CMA and to maintain the CMA output transistor in its constant current region of operation.

10 Claims, 3 Drawing Figures ns. 4,055,812

CURRENT SUBTRACTOR

This invention relates to circuits for performing the arithmetic operation of current subtraction and in particular, to subtractor circuits utilizing current mirror amplifiers (CMA's).

It is often desirable to obtain the difference of two currents. Circuits for performing this operation utilizing a plurality of operational amplifiers are known in the art. Also known is the use of a CMA as the subtraction element. For example, Limberg, U.S. Pat. No. 3,564,438 and Frederiksen et al., U.S. Pat. No. 3,648,154, each show the use of a two transistor CMA realized with bipolar transistors wherein a first current is appled to the CMA input path, which path includes a diode connected transistor and a second current is applied to the path conventionally used as the CMA output path, said path comprising the collector-emitter path of a transistor. A current proportional to the difference between the first and second current is obtained at the collector of the transistor connected in the CMA output path.

It is often desirable, for reasons to be discussed infra, that substantially equal voltage drops be maintained across each of the devices comprising the CMA. Such a result is achieved in Limberg by connecting the input diode (or diode-connected transistor) of a second CMA across the collector-emitter path of the output transistor of the first CMA. Thus, the collector-emitter voltage of this device is maintained by the subsequent stage at a value of $V_{BE}$ (where $V_{BE}$ equals the forward biased voltage drop of a diode or the base-emitter voltage drop of a transistor) which is substantially equal to the voltage across the corresponding path of the input device of the first CMA. Frederiksen achieves a similar result by connecting the base-emitter junction of a transistor across the collector-emitter path of the CMA output transistor.

It is also desirable, for reasons to be discussed infra, that the transistor in the CMA output path be operated in its constant current region. For a bipolar device this means avoiding the saturation region of its operating characteristics. For a conductor-insulator-semiconductor (CIS) device such as a metal-oxide-semiconductor (MOS) transistor, the region to be avoided is the so-called triode portion of the operating characteristics. This feature is not present in Frederiksen. When the current supplied to the "non-inverting-input" of the circuit shown at FIG. 3 of Frederiksen is greater than that supplied to the "inverting input," the operating point of the CMA output transistor shifts out of the desired constant current region.

In Limberg it is possible to maintain the operating point of the output transistor in the desired region. However, this is done by providing a level of bias current to the stage following the CMA subtractor high enough such that the CMA output transistor remains in the desired mode of operation for all input conditions of the subtractor. A characteristic of this approach, which may be undesirable in certain applications, is that a high level of bias current may be required to realize the desired result, thereby placing additional loading requirements on the circuit power supply as well as creating power dissipation problems within the circuit.

Figure 2:
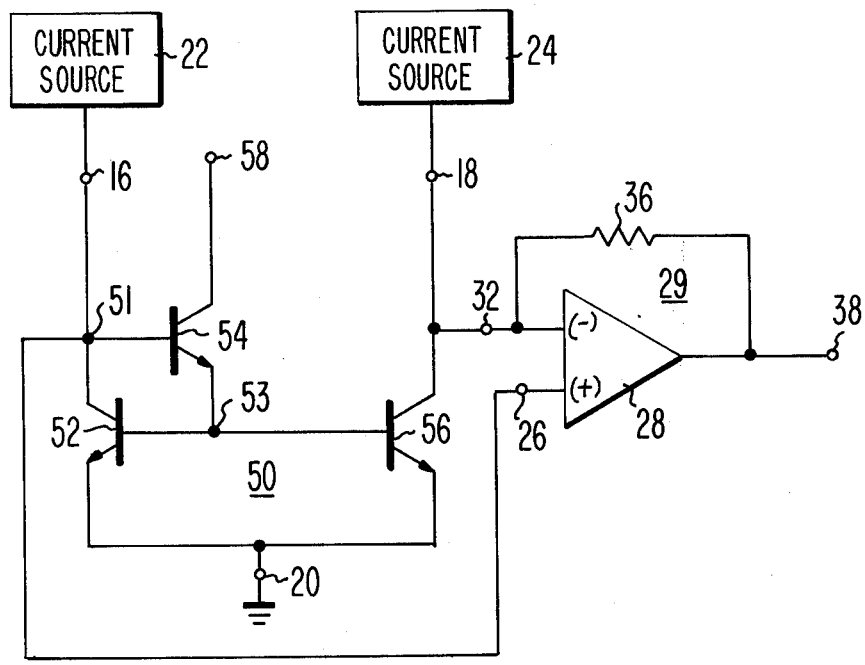
Figure 3:
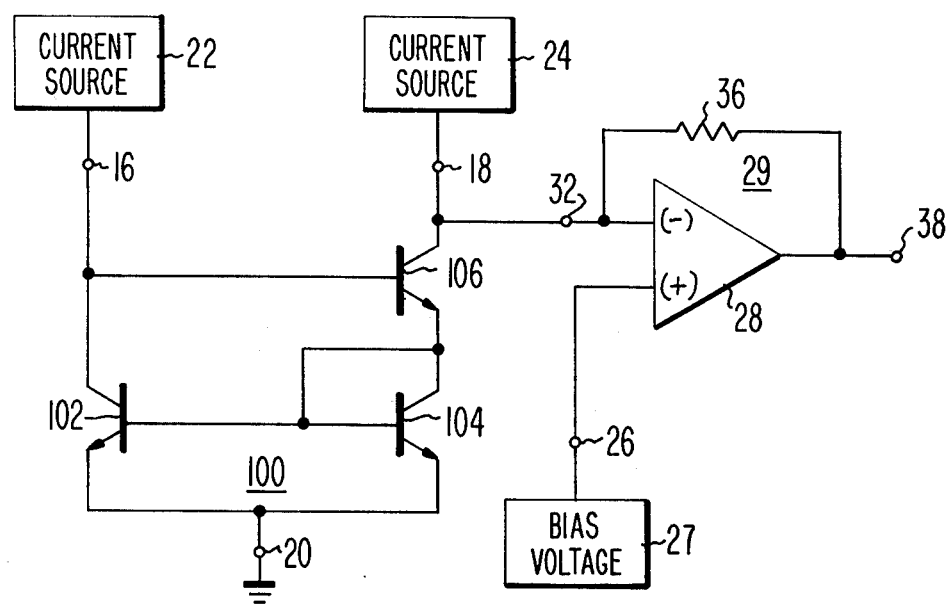

In the drawing, wherein corresponding elements have been given like reference designations;

FIGS. 1-3 are schematic circuit diagrams of various embodiments of the invention.

In FIG. 1, N type MOS transistors 10 and 12 comprise CMA 14. The drain-source path of transistor 10 is connected between the input and common terminals 16 and 20 of the CMA and the drain-source path of transistor 12 is connected between the output and common terminals 18 and 20. Terminals 16 and 18 are connected to current sources 22 and 24, respectively, while terminal 20 is connected to a reference potential, herein ground. The non-inverting input terminal 26 of amplifier 28 as well as the gate and drain electrodes of transistor 10 and the gate electrode of transistor 12 are interconnected at node 30. Inverting input terminal 32 of amplifier 28 is connected to terminal 18 while feedback resistor 36 is connected between terminal 32 and circuit output terminal 38.

In the operation of the circuit of FIG. 1, assume that CMA 14 is a unity gain mirror. That is, the amplitude of the current flowing through the input current path of the CMA (the drain-source conduction path of transistor 10) causes a current to flow through the output current path of the CMA (the corresponding path of transistor 12) whose value nominally equals that of the current through transistor 10. It should be appreciated that the CMA gain may be chosen to be greater or less than unity if desired. Also, this CMA may be realized with bipolar transistors. Let currents $I_{16}$ and $I_{18}$ be applied to terminals 16 and 18 from respective current sources 22 and 24. Current $I_{16}$ causes a current to flow away from node 13 and through transistor 12 which also equals $I_{16}$. The current $I_{18}$ supplied by source 24 flows into node 13. To satisfy Kirchoff's Current Law at node 13, a current $I_{32}$ flows through terminal 32 equal in magnitude to the difference between $I_{16}$ and $I_{18}$ and having a direction dependent on the relative amplitudes of currents $I_{16}$ and $I_{18}$.

Amplifier 28 and resistor 36 comprise feedback amplifier 29. This amplifier produces a voltage at terminal 38 that is proportional to the difference current $I_{32}$. This voltage equals $I_{32}R_{36}$, where $R_{36}$ equals the resistance of resistor 36. The output voltage may be positive or negative depending on the direction of current flow through terminal 32. When $I_{16}$ is greater than $I_{18}$, current flows from terminal 32 into node 13. Because of the negative gain of amplifier 28, the voltage at terminal 38 is positive. A negative output voltage results when the amplitude of $I_{18}$ is greater than that of $I_{16}$.

Amplifier 29, in addition to performing the above-described current-to-voltage conversion, has additional functions. As mentioned earlier, it is highly desirable that transistor 12 operate in the so-called constant current portion of its operating characteristics. In this region, the value of the drain to source voltage has relatively little effect on the value of the drain current as compared with its effect on drain current when the device is operated outside of this region. Once the operating point of the transistor in the output path of the CMA shifts out of this constant current region, the desired mirroring gain ratio is no longer maintained. This is true whether the CMA is realized with bipolar or MOS transistors or a combination thereof. This change in gain ratio introduces an error into the arithmetic operation.

The operating point of transistor 12 attempts to shift out of the desired region of operation when its conduction path current, as determined by the current $I_{16}$, exceeds the current $I_{18}$. Such a condition, when a transistor is conditioned to conduct more current than is supplied to its conduction path, causes the voltage across the conduction path to decrease to a very small value, for example, 0.2 volts. Such a decrease shifts the operating point of the transistor to the undesired region of its characteristics. This shift would occur in the circuit of FIG. 1 but for the effect of amplifier 29.

The operating point of transistor 12 is maintained in the desired operating region, in part, by taking advantage of the fact that the voltage drop between the inverting and non-inverting input terminals of a relatively high gain operational amplifier is very small. Because of the direct drain to gate connection of transistor 10, the drain to source voltage of the device appears at node 30. The voltage at node 30, which node is connected to terminal 26 of amplifier 28, equals the threshold voltage of transistor 10. This voltage, minus the small drop between amplifier terminals 26 and 32, appears at node 13 as the drain-to-source voltage of transistor 12. Thus, the voltages at nodes 30 and 13 are maintained at substantially the same value.

The mere presence of the above described voltage at node 13 is not enough to maintain transistor 12 in the desired operating mode. If it were, the use of a semiconductor diode connected between nodes 13 and 20 as described in Frederiksen would be adequate. What is also needed at node 13 is a means capable of supplying current to node 13 or withdrawing current from this node, depending on the relative values of current $I_{16}$ and $I_{18}$. A semiconductor diode alone is not able to supply current in both directions. However, the combination of amplifier 28 and feedback resistor 36 has the desired property. Additionally, unlike the circuit disclosed by Limberg, the desired current flow is not supplied at the expense of undesired quiescent current flow. When the voltage at node 13 attempts to decrease because $I_{16}$ is greater than $I_{18}$, this decrease, because of the inverting action of amplifier 29, tends to cause the voltage at terminal 38 to increase. This condition tends to increase the voltage drop across resistor 36 thereby increasing current flow through this element in a direction tending to satisfy the current demands of transistor 12. Consequently, the voltage at node 13 does not reduce to an undesired value. Amplifier 29 supplies only the current necessary to maintain the output transistor in its desired region of operation.

An additional benefit is derived from the use of amplifier 29 in the above described configuration. While transistors 10 and 12 are operated in a region of their characteristics that is known as the constant current region, this designation of the device characteristics is only approximately accurate. This is because, in an MOS device, the value of the drain to source voltage does have some effect on the value of the drain current due primarily to the presence of an effect known as channel length modulation. That is, two similar devices, each having a different drain to source voltage, produce slightly different drain currents. This is due to the fact that the voltage across the drain and source electrodes serves to alter the length of the conduction path between these electrodes. By maintaining the drain to source voltage of transistors 10 and 12 equal as is done in the circuit of FIG. 1 this effect and the inaccuracies in the mirroring ratio caused by this effect are avoided.

A somewhat analogous effect occurs, which may be avoided by the use of the present invention, when the mirror is realized with bipolar transistors. A variation in the collector voltage of the bipolar transistor causes a modulation of the base width of the device. For a bipolar transistor this is known as the Early effect. The sensitivity of current though a device as a function of the voltage across its conduction path is more pronounced with MOS transistors than with bipolar devices.

Amplifier 28 is a differential input circuit that may be realized by way of example with a high gain differential amplifier or with a commercially available operational amplifier such as the CA 3008 manufactured by RCA Corporation. It should be noted that amplifier 28 and resistor 36 in combination, in addition to performing its known function of current-to-voltage conversion, has the synergistic effect of providing the additional features of equalizing the voltage across the CMA devices and maintaining the operating points of these devices within the desired region of their characteristics.

The circuit of FIG. 2 shows that the invention may be used in conjunction with a mirror configuration that is different from that used in the circuit of FIG. 1. In FIG. 2 CMA 50 has replaced CMA 14 of FIG. 1. CMA 50 is connected between terminals 16, 18 and 20. All other connections are unchanged from the circuit of FIG. 1. CMA 50 is realized by way of example with bipolar transistors although it should be appreciated that this CMA may also be realized with MOS transistors. In CMA 50 the direct collector to base feedback connection of the input transistor, as used in conjunction with CMA 14, has been replaced by the base emitter path of transistor 54. The collector electrode of transistor 54 is connected at terminal 58 to an operating potential. Input terminal 32 of amplifier 29 is connected to the collector electrode of transistor 56 while terminal 26 is connected at node 51 to the collector electrode of transistor 52. As with the circuit of FIG. 1, amplifier 29 in the circuit of FIG. 2 provides the functions of current-to-voltage conversion, maintaining transistor 56 in its constant current region and maintaining the collector to emitter voltages of transistors 52 and 56 at substantially the same value. The voltage at node 51 equals the sum of the forward base emitter voltage drops of transistors 52 and 54 or $2V_{BE}$. This is essentially the voltage applied to the collector of transistor 56.

Alternatively, terminal 26 of amplifier 29 may be connected to the base electrode of transistor 52 instead of to the collector of this device. However, in this case, the value of the collector to emitter voltages of transistors 52 and 56 would not be equal, this voltage equaling $2V_{BE}$ for the former device and $IV_{BE}$ for the latter.

The invention described herein may be used in conjunction with a CMA having an unequal number of devices in its input and output current paths. Such a configuration is shown in FIG. 3. CMA 100 is connected between terminals 16, 18 and 20. The collector-emitter path of NPN transistor 102, which comprises the CMA input current path, is connected between terminals 16 and 20 while the serially connected collector-emitter paths of NPN transistors 104 and 106, which comprise the CMA output current path, are connected between terminals 18 and 20. The base electrodes of transistors 102 and 104 as well as the collector electrode of transistor 104 are interconnected and the base electrode of transistor 106 is connected to the collector electrode of transistor 102. Input terminal 32 of amplifier 29 is connected to the collector electrode of transistor 106 while input terminal 26 is connected to bias voltage source 27.

In the operation of the circuit of FIG. 3, the bias voltage applied to terminal 26 is chosen to be of a value adequate to maintain transistors 104 and 106 in their constant current region. A bias voltage of $2V_{BE}$ would achieve this result. Alternative source 27 may be dispensed with and terminal 26 of amplifier 29 connected to terminal 16. In addition, the technique of returning terminal 26 to a source of bias voltage as shown in FIG. 3 may be utilized in conjunction with the circuits of FIGS. 1 and 2 if desired.

It should be appreciated that the CMAs illustrated may be realized with transistors of the opposite conductivity type to that shown. Also, the invention described herein may be used in conjunction with CMAs realized with bipolar or CIS transistors having configurations different from those shown. For example, it may be used with CMA configurations having more than one transistor in their input current paths.

What is claimed is:

1. A circuit for obtaining an output signal proportional to the difference between a first input signal current and a second input signal current comprising, in combination:
   a current mirror amplifier (CMA) having an input terminal to which said first input signal current is applied, an output terminal to which said second input signal current is applied, and a common terminal connected to a point of reference potential;
   a source of bias voltage;
   a differential-input amplifier having an inverting input terminal coupled to said output terminal of said CMA, a non-inverting input terminal connected to said source of bias voltage, and an output terminal from which said output signal can be taken; and
   means connecting said differential-input amplifier as a current-to-voltage converter, which means includes
   a direct current feedback path through a resistance connected between said output and said inverting terminals of said amplifier.

2. The combination as set forth in claim 1 wherein said source of bias voltage comprises the threshold voltage of a conductor-insulator-semiconductor transistor.

3. The combination as set forth in claim 1 wherein said source of bias voltage comprises the forward base-emitter voltage drop of at least one bipolar transistor.

4. A circuit as set forth in claim 1 wherein source of bias voltage comprises the current path between said input terminal and said common terminal of said CMA.

5. A circuit as set forth in claim 1, wherein said source of bias voltage is external of said CMA.

6. In combination:
   first, second and third terminals;
   a current mirror amplifier (CMA) having an input current path and an output current path, said input current path connected between said first and third terminals and said output current path connected between said second and third terminals;
   a differential-input amplifier having inverting and non-inverting signal input terminals, said inverting and non-inverting terminals connected to said second and first terminals respectively; and
   means connecting said differential-input amplifier as a current-to-voltage converter, which means includes
   a resistance connected between said inverting and said output terminals.

7. A subtraction circuit for obtaining an output signal proportional to the difference between a first input signal current and a second input signal current comprising:
   a first terminal for application of a reference potential;
   second and third terminals for application of said first and said second input currents, respectively;
   a fourth terminal from which said output signal is to be available;
   first and second transistors of like type, each having first and second electrodes and a controlled principal conduction path therebetween and having a control electrode, the conduction of its principal conduction path being controlled by the potential between its first and control electrodes;
   means connecting said first and second transistors as a current mirror amplifier, said means including
   connections of the first electrodes of said first and second transistors to said first terminal,
   connections of the second electrodes of said first and said second transistors respectively to said second terminal and to said third terminal,
   an interconnection between the control electrodes of said first and second transistors, and
   means connecting said second terminal to the interconnection between the control electrodes of said first and second transistors, thereby completing a degenerative feedback loop connection that establishes a bias voltage at said second terminal; and
   a current-to-voltage converter connecting said third terminal to said fourth terminal, said converter including
   an amplifier having an inverting input terminal connected to said third terminal, having an output terminal connected to said fourth terminal, having a resistance connected between its output and inverting input terminals, and being biased to maintain said third terminal at substantially said bias voltge.

8. A subtraction circuit as set forth in claim 7 wherein said amplifier is a differential-input amplifier having a non-inverting input terminal connected to said second terminal.

9. A subtraction circuit as set forth in claim 7 wherein said means connecting said second terminal to the interconnection of the control electrodes of said first and said second transistors consists of their direct connection to each other without substantial intervening impedance.

10. A subtraction circuit as set forth in claim 7 wherein said means connecting said second terminal to the interconnection of the control electrodes of said first and said second transistors comprises a third transistor in potential follower connection between said second terminal and said interconnection.

* * * * *

UNITED STATES PATENT OFFICE
CERTIFICATE OF CORRECTION

PATENT NO. : 4,055,812
DATED : October 25, 1977
INVENTOR(S) : Bruce David Rosenthal It is certified that error appears in the above-identified patent and that said Letters Patent are hereby corrected as shown below:

Col 1, line 15, "appled" should be --applied--.
Col 4, line 47, "$IV_{BE}$" should be --$1V_{BE}$--.
Col 5, line 2, "Alternative" should be --Alternatively--.
Col 6, line 43 "voltge" should be --voltage--.

Signed and Sealed this

Twenty-third Day of May 1978

[SEAL]

Attest:

RUTH C. MASON
Attesting Officer

LUTRELLE F. PARKER
Acting Commissioner of Patents and Trademarks